(12) United States Patent
Yeo et al.

(10) Patent No.: US 6,949,451 B2
(45) Date of Patent: Sep. 27, 2005

(54) SOI CHIP WITH RECESS-RESISTANT BURIED INSULATOR AND METHOD OF MANUFACTURING THE SAME

(75) Inventors: Yee-Chia Yeo, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/384,859

(22) Filed: Mar. 10, 2003

(65) Prior Publication Data

US 2004/0178447 A1 Sep. 16, 2004

(51) Int. Cl.[7] .............................................. H01L 21/20
(52) U.S. Cl. ...................... 438/479; 478/480; 478/481
(58) Field of Search ............................... 438/478–479, 438/480–481, 149, 517, 910, 347; 257/411, 347, 348

(56) References Cited

U.S. PATENT DOCUMENTS

| | | |
|---|---|---|
| 4,072,974 A | 2/1978 | Ipri |
| 5,013,681 A | 5/1991 | Godbey et al. |
| 5,024,723 A | 6/1991 | Goesele et al. |
| 5,213,986 A | 5/1993 | Pinker et al. |
| 5,374,564 A | 12/1994 | Bruel |
| 5,468,657 A | 11/1995 | Hsu |
| 5,633,588 A | 5/1997 | Hommei et al. |
| 5,659,192 A | 8/1997 | Sarma et al. |
| 5,663,588 A | 9/1997 | Suzuki et al. |
| 5,739,574 A | 4/1998 | Nakamura |
| 5,759,898 A | 6/1998 | Ek et al. |
| 5,769,991 A | 6/1998 | Miyazawa et al. |
| 5,792,669 A * | 8/1998 | Baumann et al. ............ 436/507 |
| 5,849,627 A * | 12/1998 | Linn et al. .................. 438/455 |
| 5,863,830 A | 1/1999 | Bruel et al. |
| 5,882,981 A | 3/1999 | Rajgopal et al. |
| 5,882,987 A * | 3/1999 | Srikrishnan ................. 438/458 |
| 5,904,539 A | 5/1999 | Hause et al. |
| 6,022,799 A * | 2/2000 | Foote et al. ................. 438/637 |
| 6,023,082 A | 2/2000 | McKee et al. |
| 6,143,070 A | 11/2000 | Bliss et al. |
| 6,159,824 A * | 12/2000 | Henley et al. .............. 438/455 |
| 6,207,005 B1 * | 3/2001 | Henley et al. ......... 156/345.32 |

(Continued)

FOREIGN PATENT DOCUMENTS

| | | | |
|---|---|---|---|
| JP | 2003229577 | * 8/2003 | ......... H01L/29/786 |
| JP | 2003289144 | * 10/2003 | ......... H01L/29/786 |

OTHER PUBLICATIONS

Current, M.I., "Nanocleaving: An Enabling Technology for Ultra–thin SOI," Silicon Genesis Corporation, Extended Abstracts of International Workshop on Junction Technology 2002, Japan Society of Applied Physics, pp. 97–102.

(Continued)

*Primary Examiner*—Long Pham
*Assistant Examiner*—Thao X. Le
(74) *Attorney, Agent, or Firm*—Slater & Matsil, L.L.P.

(57) ABSTRACT

A semiconductor-on-insulator structure includes a substrate and a buried insulator stack overlying the substrate. The buried insulator stack includes a first dielectric layer and a recess-resistant layer overlying the first dielectric layer. A second dielectric layer can overlie the recess-resistant layer. A semiconductor layer overlying the buried insulator stack. Active devices, such as transistors and diodes, can be formed in the semiconductor layer.

44 Claims, 7 Drawing Sheets

U.S. PATENT DOCUMENTS

| | | |
|---|---|---|
| 6,252,284 B1 | 6/2001 | Muller et al. |
| 6,291,321 B1 | 9/2001 | Fitzgerald |
| 6,326,285 B1 * | 12/2001 | Behfar et al. ............... 438/455 |
| 6,335,231 B1 | 1/2002 | Yamazaki et al. |
| 6,355,541 B1 | 3/2002 | Holland et al. |
| 6,358,806 B1 | 3/2002 | Puchner |
| 6,368,938 B1 | 4/2002 | Usenko |
| 6,407,406 B1 | 6/2002 | Tezuka |
| 6,410,371 B1 | 6/2002 | Yu et al. |
| 6,410,938 B1 | 6/2002 | Xiang |
| 6,429,061 B1 | 8/2002 | Rim |
| 6,455,398 B1 * | 9/2002 | Fonstad et al. ............. 438/459 |
| 6,486,008 B1 | 11/2002 | Lee |
| 6,497,763 B2 | 12/2002 | Kub et al. |
| 6,534,380 B1 | 3/2003 | Yamauchi et al. |
| 6,534,382 B1 | 3/2003 | Sakaguchi et al. |
| 6,562,703 B1 | 5/2003 | Maa et al. |
| 6,583,440 B2 * | 6/2003 | Yasukawa ................... 257/59 |
| 6,603,156 B2 | 8/2003 | Rim |
| 6,633,061 B2 * | 10/2003 | Lutzen et al. ............... 257/305 |
| 6,649,492 B2 * | 11/2003 | Chu et al. ................... 438/478 |
| 6,661,065 B2 * | 12/2003 | Kunikiyo .................... 257/411 |
| 6,670,677 B2 * | 12/2003 | Choe et al. .................. 257/355 |
| 6,690,043 B1 * | 2/2004 | Usuda et al. ............... 257/194 |
| 2001/0001490 A1 | 5/2001 | Sung et al. |
| 2002/0125475 A1 * | 9/2002 | Chu et al. .................... 257/55 |
| 2002/0140031 A1 | 10/2002 | Rim |
| 2002/0185684 A1 * | 12/2002 | Campbell et al. ........... 257/347 |
| 2003/0013305 A1 * | 1/2003 | Sugii et al. ................. 438/689 |
| 2003/0080384 A1 | 5/2003 | Takahashi et al. |
| 2003/0104287 A1 * | 6/2003 | Yuasa ............................ 430/5 |
| 2003/0227057 A1 * | 12/2003 | Lochtefeld et al. ......... 257/347 |

OTHER PUBLICATIONS

Wolf, S., et al., "Silicon Processing for the VLSI Era vol. 1: Process Technology," 1986, Lattice Press, Sunset Beach, CA, pp. 191, 193–194.

Current, M.L., et al. "Atomic–Layer Cleaving and Non–Contact Thinning and Thickening for Fabrication of Laminated Electronic and Photonic Materials," 2001 Materials Research Society Spring Meeting (Apr. 16–20, 2001).

Current, M.I., et al. "Atomic–layer Cleaving with $Si_x Ge_y$ Strain Layers for Fabrication of Si and Ge–rich SOI Device Layers," 2001 IEEE SOI Conference (Oct. 1–4, 2001), pp. 11–12.

Langdo, T.A., et al. "Preparation of Novel SiGe–Free Strained Si on Insulator Substrates," 2002 IEEE International SOI Conference (Oct. 2002) pp. 211–212.

Mizuno, T., et al. "Novel SOI p–Channel MOSFETs With Higher Strain in Si Channel Using Double SiGe Heterostructures," IEEE Transactions on Electron Devices, vol. 49, No. 1 (Jan. 2002) pp. 7–14.

Rim, K., et al. "Fabrication and Analysis of Deep Submicron Strained–Si N.MOSFETs," IEEE Transactions on Electron Devices, vol. 47, No. 7 (Jul. 2000) pp. 1406–1415.

* cited by examiner

SOI CHIP WITH RECESS-RESISTANT BURIED INSULATOR AND METHOD OF MANUFACTURING THE SAME

The present invention is related to commonly-assigned U.S. patent application Ser. No. 10/379,873, entitled "Method of Forming Strained Silicon on Insulator Substrate," filed Mar. 5, 2003, which application is incorporated herein by reference as if repeated in its entirety.

TECHNICAL FIELD

The present invention relates generally to semiconductor materials, and more particularly to semiconductor-on-insulator substrates with a recess-resistant layer.

BACKGROUND

Traditional silicon-on-insulator (SOI) integrated circuits are formed on SOI substrates. A cross-section of a silicon-on-insulator (SOI) substrate 100 is illustrated in FIG. 1a. SOI substrates typically have a thin layer of silicon 110, also known as the silicon active layer, disposed on an insulator layer 112 such as the buried oxide (BOX) layer. The insulator layer 112 or the buried oxide layer 112 is provided on a silicon substrate 114. The buried oxide 112 is comprised of an insulator such as silicon oxide. It electrically isolates the silicon active layer 110 from the silicon substrate 114.

In an SOI chip, as shown in FIG. 1b, the SOI substrate 100 is processed to form a plurality of active regions 116 in the active layer 110. Active devices 118 such as transistors and diodes may be formed in the active regions 116. Active regions 116 are electrically isolated from each other by isolation regions 120. The size and placement of the active regions 116 are defined by isolation regions 120. Isolation regions 120 may, for example, be formed of shallow trench isolation (STI). Moreover, active devices 118 in the active regions 116 are isolated from the substrate 114 by the buried oxide layer 112.

Active devices formed on SOI substrates offer many advantages over their bulk counterparts, including absence of reverse body effect, absence of latch-up, soft-error immunity, and elimination of junction capacitance typically encountered in bulk silicon devices. SOI technology therefore enables higher speed performance, higher packing density, and reduced power consumption. At present, commercial products using SOI technology employ an uniform active layer thickness and shallow trench isolation.

One type of SOI transistor employs a very thin silicon active layer 110. In some cases, the silicon active layer 10 thickness can be as thin as a third of the gate length. For example, if the gate length is 30 nm, the silicon active layer 110 may have a thickness of 10 nm or thinner. This type of SOI transistor is known as an ultra-thin body (UTB) transistor or a depleted-substrate transistor (DST).

When the thickness of the silicon active layer 110 is as thin as 10 nm, mesa isolation could be a more appropriate isolation scheme for the transistors as compared to shallow trench isolation. In mesa isolation, trenches 122 are formed in the active layer 110, as shown in FIG. 2a. The trenches 122 extend from the surface of the active layer 110 to the buried oxide 112. The trenches 122 divide the active layer 110 into silicon islands or silicon mesa structures that include the active areas 116. The mesa isolation method thus cuts electrical connection between adjacent active regions 116 by removing portions of the active layer 110 in the SOI substrate 100.

One problem of the mesa isolation is that the exposed buried oxide layer 112 surface will be recessed in subsequent chemical treatments such as wafer cleaning steps. This recess is illustrated in FIG. 2b. The recessed buried oxide results in a number of problems. For example, it leads to an increased parasitic capacitance between the substrate 114 and metal lines (not shown) running over the buried oxide 112. It also leads to a concentration of electric field lines around the exposed corners of the silicon mesas which potentially impact device reliability.

SUMMARY OF THE INVENTION

The present invention describes embodiments of an improved method of fabricating strained-silicon-on-insulator substrates. In one embodiment, a recess-resistant film is used with the buried insulator to prevent erosion of the buried insulator during subsequent processing steps. For example, the recess-resistant film can be a silicon nitride film, which etches ten times more slowly than silicon oxide for common wet etch processes.

In one aspect, the present invention provides a semiconductor-on-insulator substrate with a recess-resistant buried insulator. The buried insulator has a recess-resistant layer that has negligible etch rates in commonly used wet cleaning solutions.

The present invention provides several methods of fabricating the substrate structures disclosed herein. In certain of these methods, a thin film stack is transferred from a donor wafer to a target wafer. One method employs the bonding of a donor wafer with an implanted layer to a target wafer to form a wafer assembly. The thin film stack can be separated at an implanted layer to produce the desired substrate.

In another embodiment, a donor wafer is bonded to a target wafer. The donor wafer includes an interface between a strained layer and a relaxed layer. The two wafers can be separated at the interface to produce the desire substrate.

Aspects of the present invention provide advantages over prior art devices. For example, the buried insulating layer will not include recesses. This feature helps to minimize parasitic capacitance between the substrate and metal lines running over the device. This feature minimizes any concentration of electric field lines around the exposed corners of the silicon mesas and therefore enhance device reliability.

BRIEF DESCRIPTION OF THE DRAWINGS

For a more complete following descriptions taken in conjunction with the accompanying drawings, in which understanding of the present invention, and the advantages thereof, reference is now made to the.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aspects of the present invention relate generally to semiconductor materials, and more particularly to semiconductor-on-insulator substrates with a recess-resistant layer. Aspects of the present invention are also related to the manufacture of metal oxide semiconductor field effect transistors on semiconductor-on-insulator substrates with a recess-resistant layer.

According to the preferred embodiment of the present invention, a recess-resistant layer is provided in the buried insulator stack of a semiconductor-on-insulator wafer for the purpose of restricting the amount of recess in the exposed insulator stack during wafer processing such as wet cleaning of wafers in dilute hydrofluoric acid. This feature can be useful where the mesa isolation scheme is adopted in the fabrication of an semiconductor-on-insulator integrated circuit chip. Semiconductor-on-insulator integrated circuit chips employing the mesa isolation scheme have exposed buried insulator surfaces. The exposed buried insulator surfaces are susceptible to chemical attack or etching during wafer processing. In certain aspects, this invention teaches a substrate structure where a recess-resistant layer is provided.

Figure 1A:
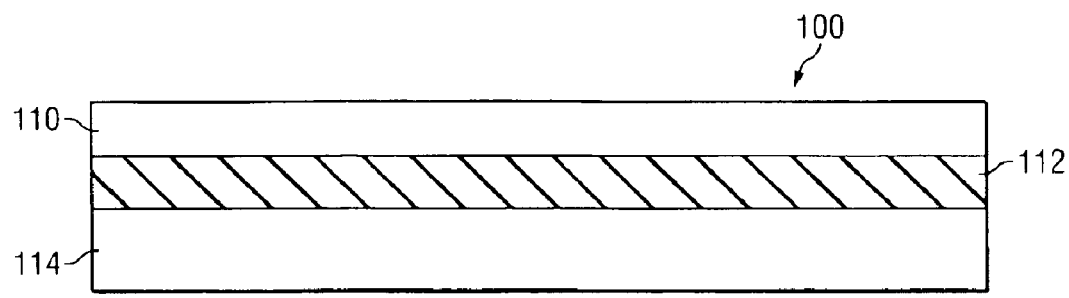
FIG. 1a shows a conventional silicon-on-insulator (SOI) substrate.
Figure 1B:
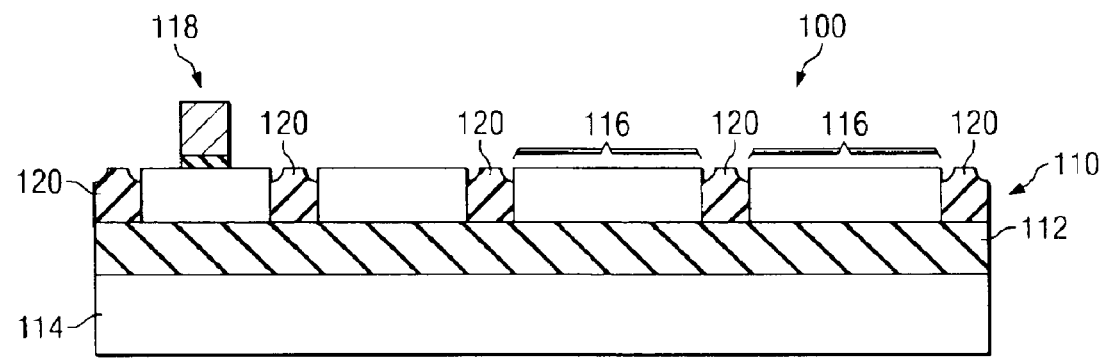
FIG. 1b shows a conventional SOI chip with uniform active layer thickness and active devices formed in active regions isolated from each other by isolation regions.
Figure 2A:
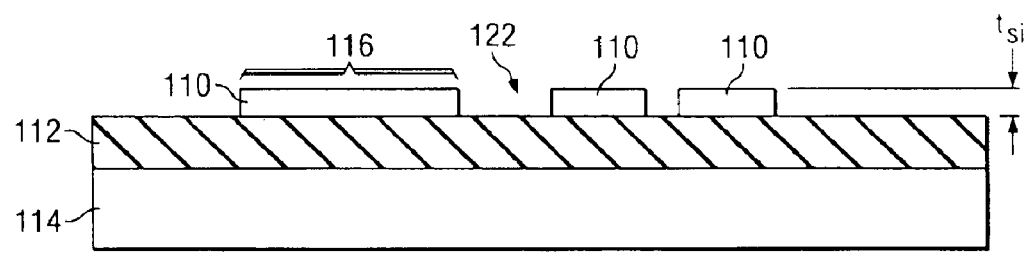
FIG. 2a shows a cross-sectional view of a SOI substrate with silicon islands or silicon mesas formed in the active layer.
Figure 2B:
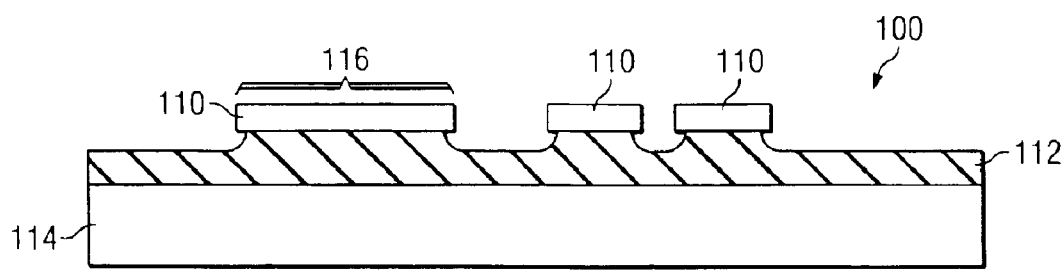
FIG. 2b shows the substrate of FIG. 2a after wet-cleaning process steps cause recesses in the buried oxide surface.
Figure 3:
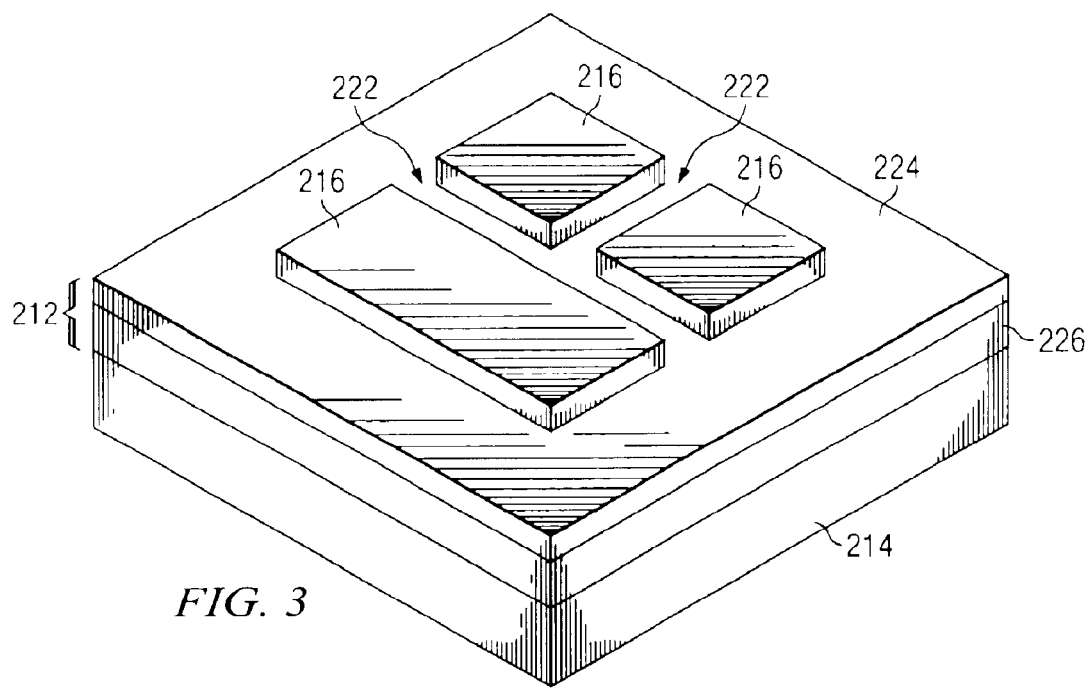
FIG. 3 shows a perspective view of a semiconductor island or semiconductor mesa formed on a buried insulator stack of a first embodiment of the present invention.

Referring now to FIG. 3, semiconductor islands or semiconductor mesas 216 are formed from a semiconductor active layer 210 (element 210 is shown, for example, in FIG. 5a, as well as other figures) by the formation of trenches 222 between them. The semiconductor islands or mesas 216 are thus electrically isolated from each other by mesa isolation. The semiconductor material constituting the active layer 210 is preferably silicon, but may also be any other elemental semiconductor such as germanium, any alloy semiconductor such as silicon-germanium, or any compound semiconductor such as gallium arsenide or indium phosphide.

The semiconductor mesas 216 are isolated from the substrate 214 by a buried insulator stack 212, as schematically shown in FIG. 3. The substrate 214 is preferably a silicon substrate, which is typically undoped but may be lightly doped. Other materials such as germanium, quartz, sapphire, and glass could alternatively be used as the substrate 214 material.

According to the preferred embodiment of the present invention, the buried insulator stack 212 comprises at least a layer of recess-resistant layer 224, which is resistant to commonly used wafer wet cleaning solutions. That is, the etch rate of the recess-resistant layer is extremely slow in commonly used wafer wet cleaning solutions so that the total amount etched is negligible. The thickness of the recess-resistant layer may range from about 2 angstroms to about 1000 angstroms, and is more preferably from about 10 angstroms to about 200 angstroms.

The recess-resistant layer 224 overlies a first dielectric layer 226. The first dielectric layer 226 can be a dielectric material such as silicon oxide, for example, and may have a thickness ranging from about 100 angstroms to about 5000 angstroms. Other dielectric layers such as silicon nitride, silicon oxynitride, aluminum oxide, or silicon carbide, as examples, can be used as the first dielectric layer 226.

To form isolation trenches 222, one commonly used wet cleaning solution is dilute hydrofluoric acid. Dilute hydrofluoric acid may, for example, be formed by a mixture of 1 part of concentrated (49%) hydrofluoric (HF) acid and 25 parts of water $H_2O$. This mixture is also commonly known as 25:1 HF. Another commonly used wafer cleaning solution is a mixture of concentrated sulphuric acid and hydrogen peroxide, commonly known as piranha solution.

The recess-resistant layer 224 of the buried insulator stack 212 preferably comprises a dielectric material that has very slow or negligible etch rates in commonly used wet cleaning solutions such as the above-mentioned chemicals or solutions. As shown in FIG. 3, the buried insulator stack 212 surface is exposed to common wet cleaning etchants in regions not covered by the semiconductor mesas 216. The recess-resistant layer 224 therefore minimizes the reduction in the physical thickness of the buried insulator stack 212. This layer 224 also prevents the formation of a significant recess in the exposed portion of the buried insulator stack 212.

In the preferred embodiment, the recess-resistant layer 224 is comprised of silicon nitride (e.g., $Si_3N_4$). The etch rate of stoichiometric silicon nitride $Si_3N_4$ in 25:1 HF is about 1 to 6 angstroms per minute. The etch rate of thermally grown silicon oxide in 25:1 HF is more than ten times higher, e.g., about 100 angstroms per minute. By using silicon nitride as a recess-resistant layer on the top surface of the buried insulator stack, as illustrated in FIG. 3, the recess in the buried insulator can be reduced by more than ten times.

Other recess-resistant materials can be used to form layer 224. For example, the layer 224 could be a nitrogen containing layer other than $Si_3N_4$. For example, the recess-resistant layer 224 could comprise of silicon nitride $Si_xN_y$, silicon oxynitride $SiO_xN_y$, silicon oxime $SiO_xN_y:H_z$, or any combinations thereof.

Figure 4:
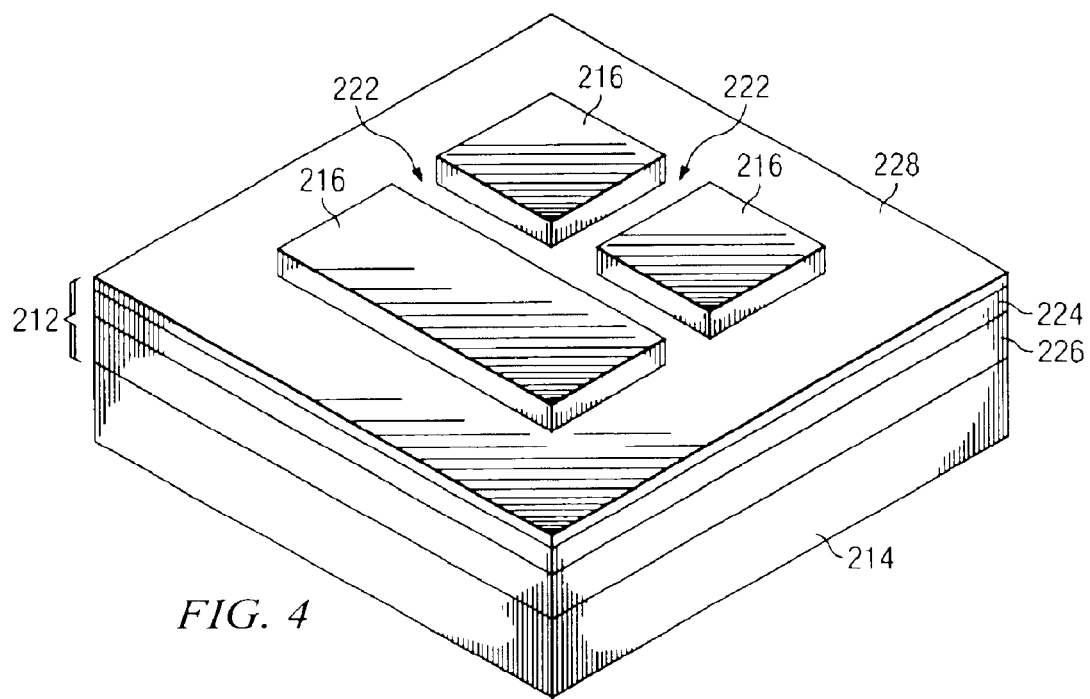
FIG. 4 shows a perspective view of a semiconductor island or semiconductor mesa formed on a buried insulator stack of a second embodiment of the present invention.

In another embodiment of the present invention, the recess-resistant layer 224 is not the topmost layer of the buried insulator stack 212. For example, FIG. 4 illustrates an embodiment where the buried insulator stack 212 includes a bottom-most dielectric layer 226. The bottom-most dielectric layer 226 is preferably silicon oxide, but may be any other dielectric such as silicon oxynitride and aluminum oxide. The thickness of the first dielectric layer is preferably from about 100 angstroms to about 5000 angstroms.

The recess-resistant layer 224 overlies the bottom-most dielectric layer 226. The recess-resistant layer 224 in this embodiment is preferably silicon nitride. The recess-resistant layer is preferably about 2 to about 1000 angstroms thick and more preferably from about 10 to about 200 angstroms thick. In the preferred embodiment, the recess-resistant layer 224 has an etch rate that is at least about ten times less than the etch rate of the second dielectric layer 228.

The second dielectric layer 228 overlies the recess-resistant layer 224. In this embodiment, the second dielectric layer 228 is in contact with the semiconductor mesas 216 and is preferably silicon oxide. The second dielectric layer 228 serves the purpose of providing a high quality interface between the buried insulator stack 212 and the semiconductor mesas 216. It is known that the interface between silicon oxide and silicon has a much better and lower interface state density than the interface between silicon nitride and silicon.

A second dielectric layer 228 with good interface properties and low bulk trap density can be helpful to achieve good electrical characteristics in the active devices (not shown in FIG. 4). This interface can be especially important in active devices with ultra-thin body thicknesses, in which case the mobile carriers flowing between the source and drain are in close proximity to the interface between the active layer 210 and the buried insulator stack 212. For example, trapped charges or charge centers near the top of the buried insulator stack 212 may degrade the carrier mobility in the channel region of an ultra-thin body transistor by Coulombic scattering. The use of a high quality second dielectric layer 228 with a low bulk trap density and a low interface trap density ensures that mobility degradation due to Coulombic scattering is kept to a minimum.

In addition, since the second dielectric layer 228 might not have a very slow etch rate in common wet cleaning solutions and may be removed by the cleaning solutions, the thickness of the second dielectric layer 228 is preferably kept very thin to limit the amount of recess in the buried insulator stack. If the second dielectric layer is silicon oxide, the recess of the buried insulator stack in the exposed portion will be approximately equal to the thickness of the second dielectric layer 228. According to the preferred embodiment, the second dielectric layer 228 may have a thickness in the range of about 10 to about 200 angstroms.

Figure 5A:
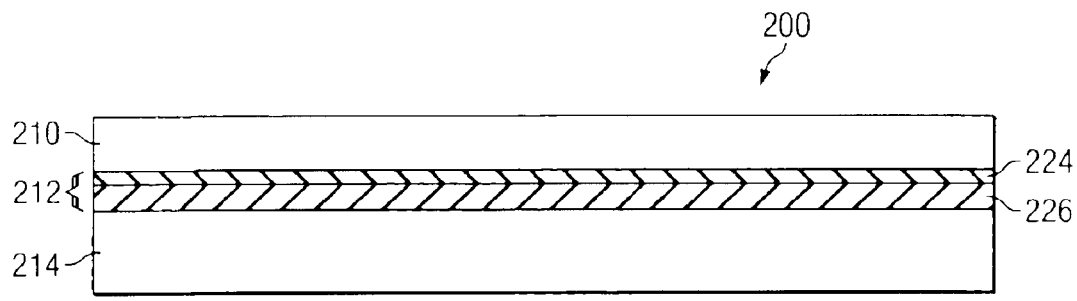
FIGS. 5a and 5b show cross-sectional views of SOI substrates of the present invention.
Figure 5B:
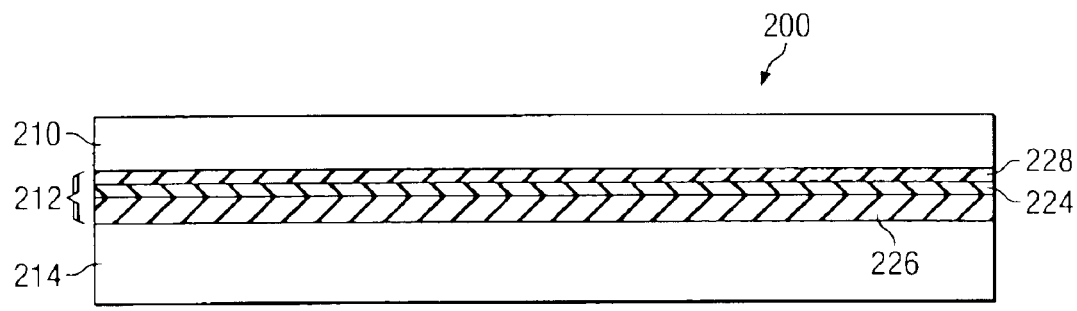

FIGS. 5a and 5b show the cross-sections of the SOI substrate structures according to the preferred embodiment of the present invention. One feature of the preferred embodiment is the recess-resistant layer 224. The starting SOI substrate 200 includes a semiconductor active layer 210 overlying a buried insulator stack 212, where the buried insulator stack includes at least a recess-resistant layer 224. In the embodiment of FIG. 5a, the recess-resistant layer 224 is in contact with the active layer 210 and is the upper-most layer of the buried insulator stack 212. In the embodiment of FIG. 5b, the recess-resistant layer 224 is sandwiched by two other dielectric layers 226 and 228. Such substrates may be best manufactured by a wafer bonding process.

Figure 6A:
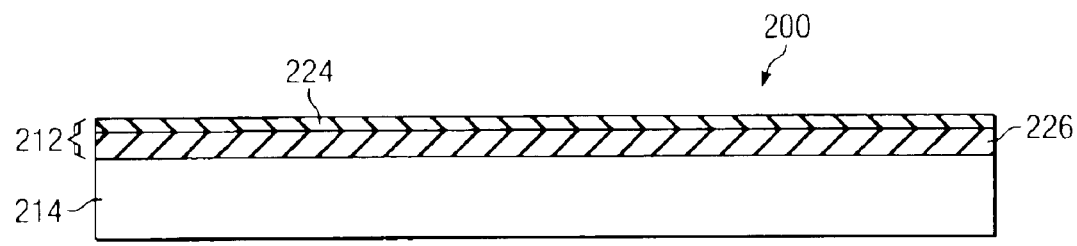
FIGS. 6a–6f show cross-section views of an SOI substrate during sequential steps of a first embodiment fabrication method of the present invention.

An example of how a substrate of FIG. 5b may be formed is to be described next with respect to FIGS. 6a–6f. In the preferred embodiment, the first dielectric layer 226 and second dielectric layer 228 are silicon oxide and the recess-resistant layer 224 is silicon nitride. FIG. 6a shows a handle or target wafer 200 that comprises a silicon nitride recess-resistant layer 224 overlying a first dielectric layer 226 of silicon oxide. The first dielectric layer 226 is provided on a silicon substrate 214.

The target wafer of FIG. 6a may be formed by a thermal oxidation of a silicon substrate 214 followed by a silicon nitride deposition. The thermally grown silicon oxide layer may have a thickness in the range of about 100 to about 5000 angstroms. The silicon nitride layer may be deposited on the silicon oxide layer by chemical vapor deposition (CVD) using gas species such as ammonia and silane. The silicon nitride layer may be deposited to a thickness of about 2 to about 1000 angstroms, and more preferably from about 10 to about 200 angstroms.

Figure 6B:
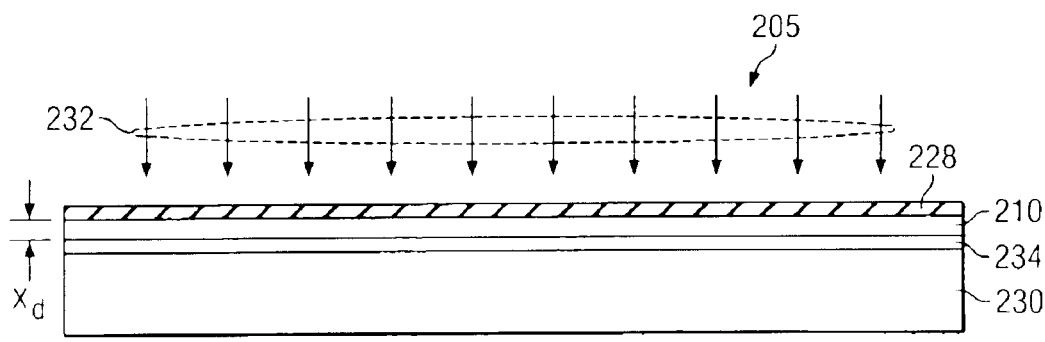

Referring now to FIG. 6b, a donor wafer 205 includes a thin silicon oxide layer 228 on a silicon substrate 230. Ions 232, e.g., of hydrogen or an inert gas such as helium, argon, neon, krypton, xenon, and combinations thereof, are implanted into the donor wafer 230 through the second dielectric layer 228. The second dielectric layer 228 is preferably a silicon oxide layer.

The peak of the implanted ions is at a depth $x_d$ below the interface between substrate 230 and second dielectric layer 228. The implanted ions result in an implanted layer 234 and a silicon film 224, as shown in FIG. 6b. In the preferred embodiment, the implanted ions are hydrogen ions. The dose of the implanted ions may be approximately $10^{15}$ cm$^{-2}$ or higher. The implantation energy depends on the desired implant depth, and may generally range from about 1 keV to about 500 keV. The value of $x_d$ defines the thickness of the active layer 224 on the silicon-on-insulator substrate 200. The ions may be implanted by a variety of techniques, including beam line ion implantation, plasma immersion ion implantation (PIII) or ion shower. Hydrogen ions are desirable because they easily travel through the substrate material to the selected depth without substantially damaging the material.

Figure 6C:
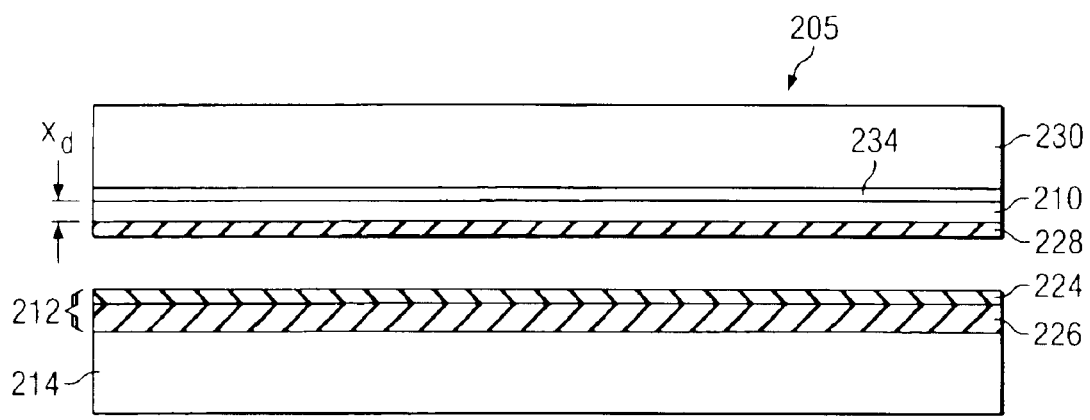
Figure 6D:
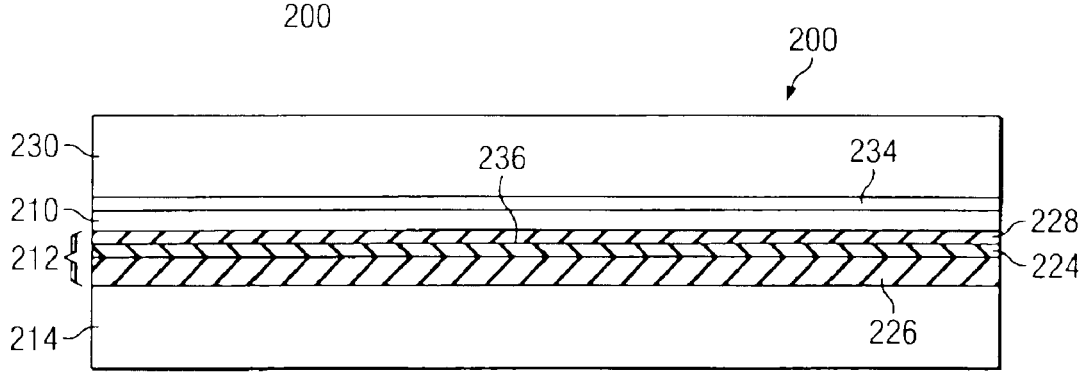

The next process step is the bonding of the top surface of the donor wafer 205, i.e., the surface of the second dielectric 228, to the top surface of the handle wafer 200, i.e., the surface of the recess-resistant layer 224. This bonding process is illustrated in FIGS. 6c and 6d. The bonding process may be a beta bonding process known and used in the art. Beta bonding is a relatively weak bonding process that joins the donor wafer and the target wafer together. It is believed that beta bonding arises from electrostatic or van der Waals forces.

Beta bonding produces a joint 236 between the donor wafer 205 and the target wafer 200. The target wafer 200 will act as a mechanical support for the thin film stack comprising of the silicon film 210 and the second dielectric layer 228 when the thin film stack is separated from the donor wafer 205. Prior to beta bonding, the surfaces of the wafers to be bonded are preferably cleaned to remove any residual liquids or particles from the wafer surfaces.

The bonding process forms a wafer assembly, as shown in FIG. 6d. The wafer assembly is then separated at the position of the implanted layer 234 using a wafer separation process known and used in the art. For example, the wafer separation process can be initiated by a heat treatment. When the temperature of the wafer assembly rises above a certain level, e.g., about 500 degrees Celsius, microbubbles formed in the implanted layer 234 expand and pressure builds up. When the pressure in the microbubbles exceeds a certain value, the donor wafer 205 will split off along a cleavage plane. This is a controlled cleaving process and also known as a SmartCut™ process, available from Silicon Genesis Corporation. It is believed that this separation occurs because a crystalline rearrangement and coalescence of microbubbles occurs to form macrobubbles with sufficient kinetics to separate the thin film stack from the donor wafer.

Figure 6E:
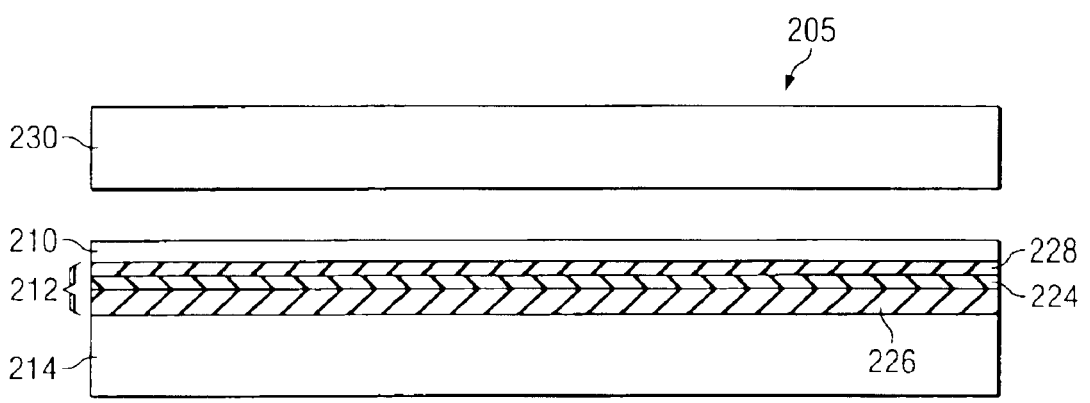

One of the separated wafers is a reusable silicon substrate. The other separated wafer is a hybrid SOI substrate 200 with a silicon nitride recess-resistant layer 224, as shown in FIG. 6e.

Figure 6F:
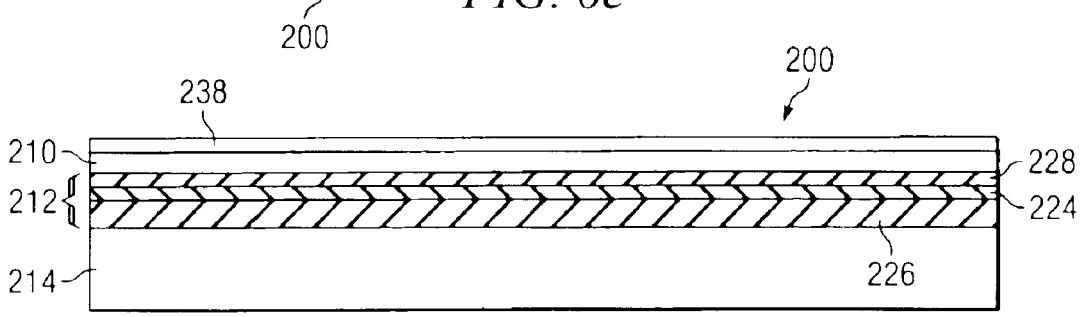

Following the wafer separation process, final bonding between the thin film stack 224/210 and the target wafer 200 is performed to yield the desired recess-resistant SOI substrate. This bonding usually requires a high temperature anneal, where the annealing temperature is typically above about 700 degrees Celsius. The final bonding step creates a strong bond between the thin film stack 224/210 and the target wafer 200. It is believed that covalent bonds are form at the joint 236 when the wafer is anneal at a sufficiently high temperature for a sufficient period of time. During the annealing, a layer of thermal oxide 238 may be grown on the silicon thin film 210 surface, as shown in FIG. 6f. The thermal oxide layer 238 may be removed by a wet etch in dilute hydrofluoric acid.

Figure 7A:
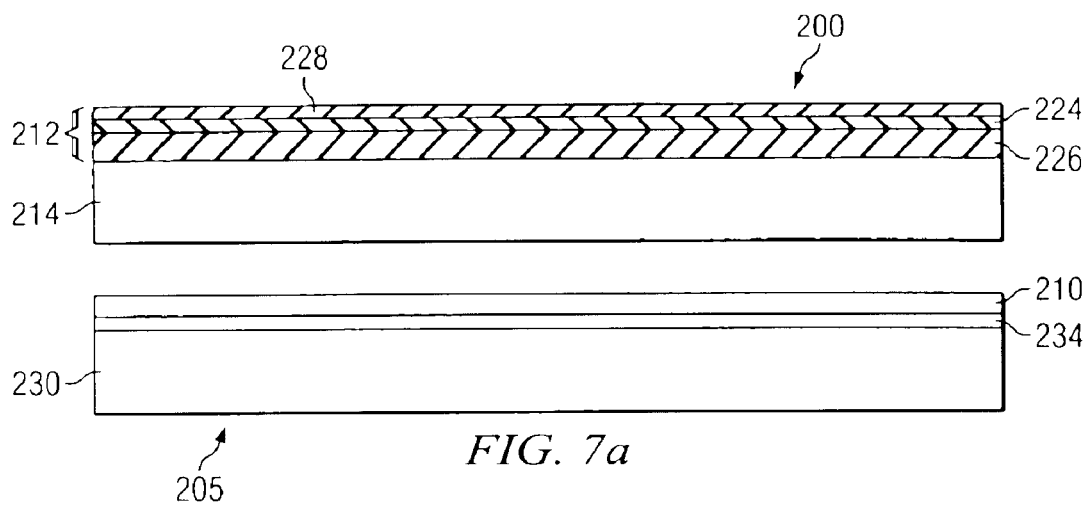
FIGS. 7a and 7b show various combinations of donor and target wafers that may achieve the SOI substrate of FIG. 5b.
Figure 7B:
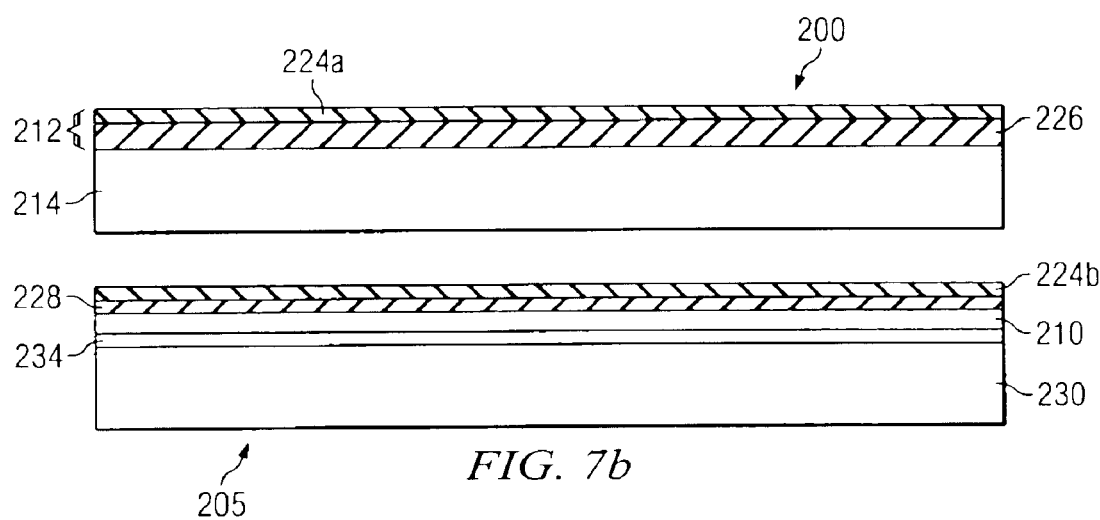

Several other combinations of donor and target wafers in the wafer bonding and wafer separation technique as described previously will result in the formation of the same substrate of FIG. 5b. Two examples of these other combinations are schematically illustrated in FIGS. 7a and 7b. In FIG. 7a, the target wafer 200 comprises a second dielectric layer 228 on a recess-resistant layer 224 on a first dielectric layer 226 formed on a substrate 214, while the donor wafer 205 has a silicon film 210 on an implanted layer 234 on a substrate 230. Bonding the top surfaces of the target and donor wafers 200 and 205 of FIG. 7a involves the bonding of the silicon film 210 to the second dielectric layer 228.

In FIG. 7b, the target wafer 200 comprises a recess-resistant layer 224a on a first dielectric layer 226 formed on a substrate 214, while the donor wafer 205 has a recess-resistant layer 224b on its top surface. Bonding the top surfaces of the target and donor wafers 200 and 205 of FIG. 7b involves the bonding of the recess-resistant layer 224b in the donor wafer to the recess-resistant layer 224a in the target wafer. The combination of the two layers 224a and 224b will provide the recess-resistant layer 224.

It is understood, according to this invention, that the substrate of FIG. 5a may similarly be manufactured by a wafer bonding and wafer separation method. In the substrate 200 of FIG. 5a, the recess-resistant layer 224 is the uppermost layer in the buried insulator 212. As an illustration, to produce such a substrate, the donor wafer may comprise a silicon film 210 on an implanted region 234 on a silicon substrate 230, and the target wafer may comprise of a silicon nitride recess-resistant layer 224 overlying a silicon oxide first dielectric layer 226 which in turn overlies a silicon substrate 214. This combination can be seen from FIG. 7a, where the top layer 228 of the target wafer 200 is not provided.

The preceding description relates to methods of manufacturing semiconductor-on-insulator substrates with a recess-resistant layer using a donor wafer with an implanted layer. In those cases, the wafer separation is initiated by a heat treatment. According to another method embodiment of this invention, the donor wafer may depend on other mechanisms to initiate the cleavage process for wafer separation. For example, the wafer separation process may be an atomic layer cleaving process or nanocleave process, such as the one described by Michael I. Current et al., in a paper entitled "Atomic layer cleaving with SiGe strain layers for fabrication of Si and Ge-rich SOI device layers," published in pp. 11–12 of the proceedings of the 2001 IEEE International SOI Conference (October 2001) and incorporated herein by reference. The nanocleave transfer process results in a layer separation using a strain-layer cleave plane.

Figure 8A:
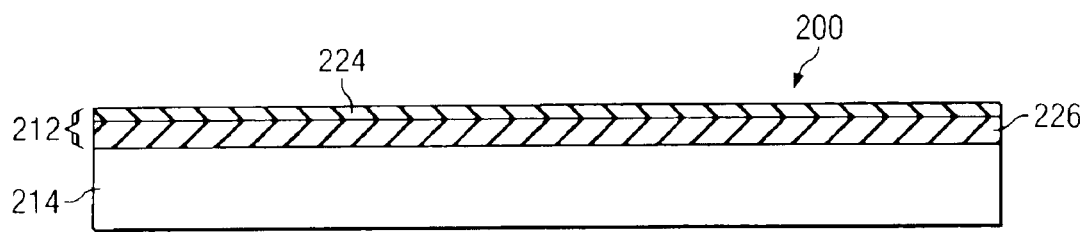
FIGS. 8a–8e show cross-section views of an SOI substrate during sequential steps of a second embodiment fabrication method of the present invention.

FIGS. 8a–8e will now be used to describe a method of manufacturing a strained-silicon-on-insulator (SSOI) substrate with a recess-resistant buried insulator layer. In this embodiment, a handle or target wafer 200, as shown in FIG. 8a, is provided. The target wafer comprises a silicon nitride recess-resistant layer 224 overlying a first dielectric layer 226, preferably comprising silicon oxide. The first dielectric layer 226 is provided on a silicon substrate 214.

Figure 8B:
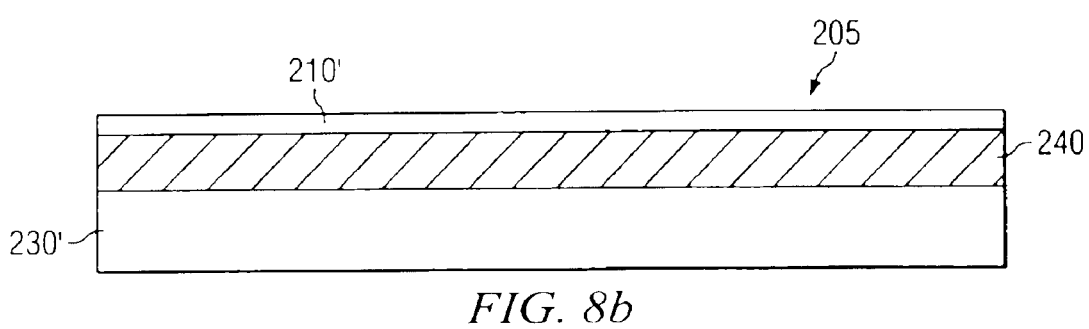
Figure 8C:
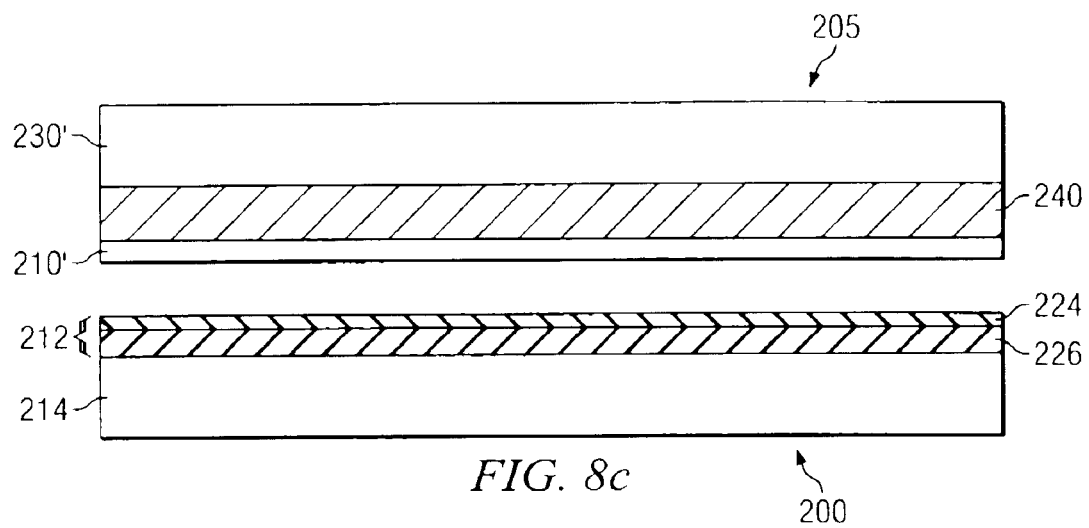
Figure 8D:
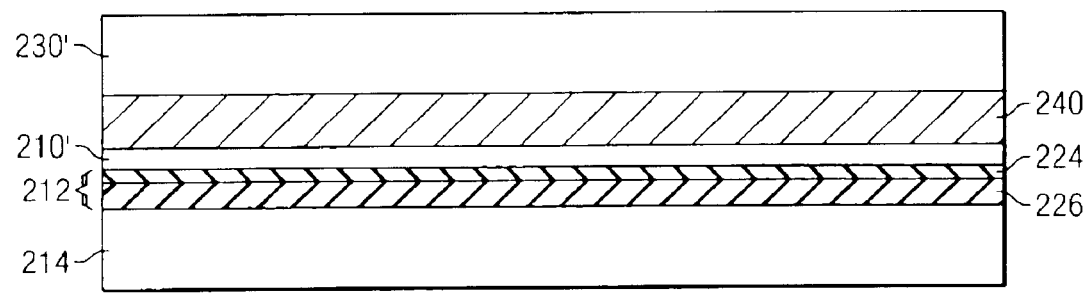

A donor wafer 205, as shown in FIG. 8b, is provided. The donor wafer comprises a strained-silicon layer 210' on a relaxed silicon-germanium (SiGe) layer 240. The substrate 230' underlying the relaxed SiGe layer 240 may be a silicon substrate or a SiGe substrate, as examples. In the case where the substrate 230' is SiGe, the germanium composition in the relaxed SiGe layer 240 and that in the substrate 230' may be the same or may be different.

The thickness of the strained silicon layer 210' is preferably less than about 500 angstroms and the strain may vary from about 0.01% to about 4%. The germanium atomic concentration in the relaxed SiGe layer 240 may range from about 0% to about 100%. There is an interface between the strained silicon layer 210' and the relaxed SiGe layer 240 and a large strain gradient exists across this interface. The strained silicon layer 210' and relaxed SiGe layer 240 may be epitaxially grown using chemical vapor deposition.

In another embodiment, the donor substrate 230' may comprise a material that has a lattice constant that is different than that of silicon. For example, if the strained silicon layer 210' is to be comprised of a tensile strain, the bulk substrate 230' of the donor wafer 205 should have a lattice constant larger than that of silicon, e.g., a bulk silicon-germanium (SiGe) wafer. If the strained silicon layer 210' is to be comprised of a compressive strain, the bulk substrate should have a lattice constant smaller than that of silicon, e.g., a bulk silicon-germanium-carbon (SiGeC) wafer. In order for the lattice constant of SiGeC to be smaller than that of silicon, the composition of germanium x and the composition of carbon y in the bulk $Si_{1-x-y}Ge_xC_y$ can be such that y>0.1x. Details of using a bulk substrate are provided in co-pending application Ser. No.10/379,873, which application is incorporated herein by reference.

Returning to the process flow of FIG. 8, the top surface of the donor wafer 204 is bonded to the top surface of the target wafer 200. The wafer bonding process is illustrated in FIG. 8c. The resulting wafer assembly is schematically shown in FIG. 8d.

Figure 8E:
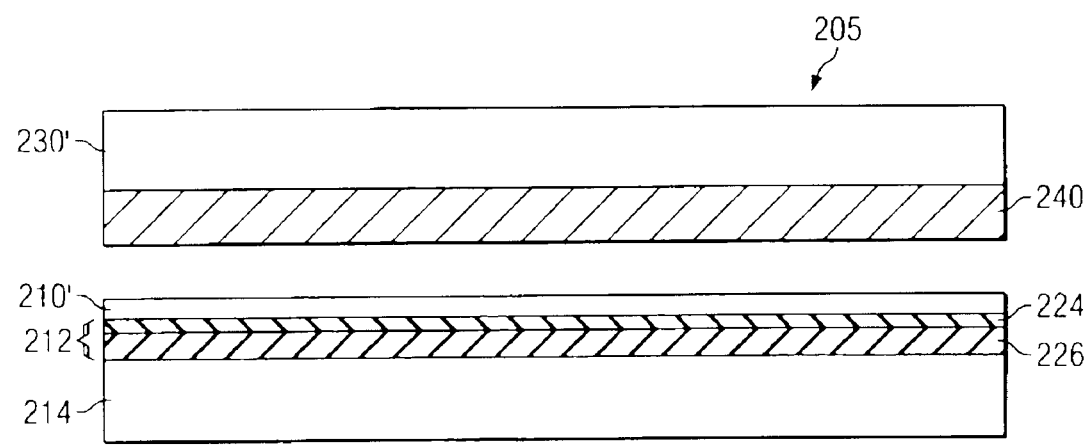

A cut or cleave can be made at or near the interface between the strained silicon layer 210' and the relaxed SiGe layer 240 using a process similar to the nanocleave process. The cleave plane will be initiated near the interface between the strained Si layer 210' and the relaxed-SiGe layer 240. Following the wafer separation process, final bonding between the strained silicon layer 210' and the target wafer 200 is performed to yield the desired recess-resistant SOI substrate. This final bonding typically requires a high temperature anneal, where the annealing temperature is typically above about 700 degrees Celsius. This results in the formation of a strained-Si layer 210' on an insulator structure 212 as illustrated in FIG. 8e. The donor wafer 205 can be reclaimed and reused.

A process of forming a device of the present invention has been described to include a wafer bonding and separation process. As examples, the wafer bonding and separation process can be a Smartcut™ process, or a Nanocleave™ process, both available from Silicon Genesis Corporation. Details of bonding and separation processes are also provided in U.S. Pat. Nos. 5,013,681, 5,374,564, 5,863,830, 6,355,541, 6,368,938, and 6,486,008, each of which is incorporated herein by reference.

It will be appreciated that the strained-silicon-on-insulator substrate with a recess-resistant layer may be manufactured by the above wafer bonding and wafer separation method using other combinations of donor and target wafers. For example, the donor wafer may have a silicon oxide overlying the strained silicon layer, or a silicon nitride on a silicon oxide stack overlying the strained silicon layer, and the target wafer may have a silicon oxide layer overlying the recess-resistant layer.

The processes described above utilize wafer bonding and separation techniques. It is understood, however, that the present invention could also be achieved using deposition processes. For example, the recess-resistant layer 224 (see e.g., FIG. 5a or 5b) can be deposited over the first dielectric layer 226, for example using a chemical vapor deposition process. The second dielectric layer 228, if used, could then be deposited over the recess-resistant layer 224 followed by an epitaxial growth of the semiconductor layer 210.

The preceding description of the present invention relates to the formation of substrates with recess-resistant layers. The present invention not only teaches the formation of such substrates, but also devices fabricated on such substrates. A method of forming a semiconductor-on-insulator chip with mesa isolation and a recess-resistant layer is to be described next.

Figure 9A:
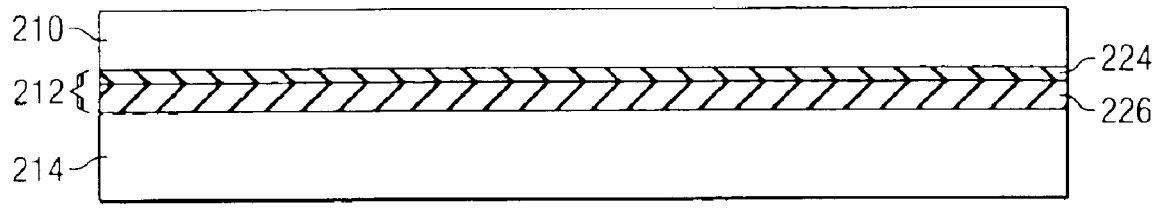
FIGS. 9a–9d show cross-sectional views illustrating a method of forming a SOI chip with a recess-resistant layer in the buried insulator stack.
Figure 9B:
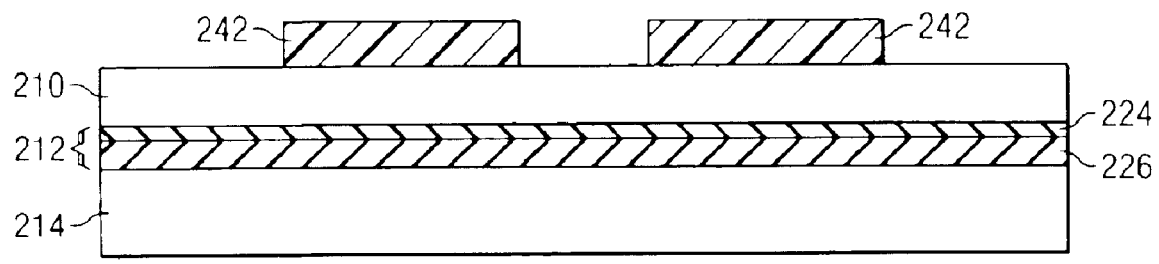

Referring now to FIGS. 9a–9d, cross-sections of the wafer are illustrated through the process of forming the semiconductor-on-insulator chip with mesa isolation and recess-resistant layer. The starting substrate, as shown in FIG. 9a, is one of the substrates previously described. A mask 242 is used to define active regions 216 in the active layer 210 (or 210'), as shown in FIG. 9b. The mask 242 may comprise any masking material known and used in the art, such as silicon oxide, silicon nitride, silicon oxynitride or photoresist, as examples. The mask can also be formed from a stack comprising, for example, a silicon nitride layer overlying a silicon oxide layer.

Figure 9C:
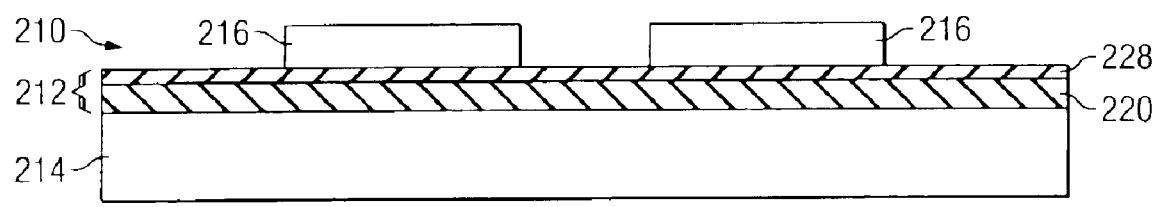

Following active region definition using a mask, the active layer 210 is etched using techniques known and used in the art. If the active layer 210 is comprised of silicon, a dry plasma etch using fluorine chemistry may be used. The mask 242 is then removed to yield the semiconductor mesas 216, the cross-sections of which are shown in FIG. 9c.

The formation of the semiconductor mesas 216 exposes regions of the buried insulator 212 not covered by the semiconductor mesas. In the subsequent process steps, the wafer may be subjected to wet cleaning, for example, before the wafer enters a gate dielectric deposition or growth chamber. The wet cleaning solutions potentially etch into the buried insulator and result in a recessed buried insulator if it is not protected by the recess-resistant layer 224. The recess-resistant layer 224, as shown in FIG. 9c, has a very low etch rate in commonly used wet cleaning solutions such as dilute hydrochloric acid, and minimizes the amount of recess in the exposed surface of the buried insulator. Next, active devices are formed.

Figure 9D:
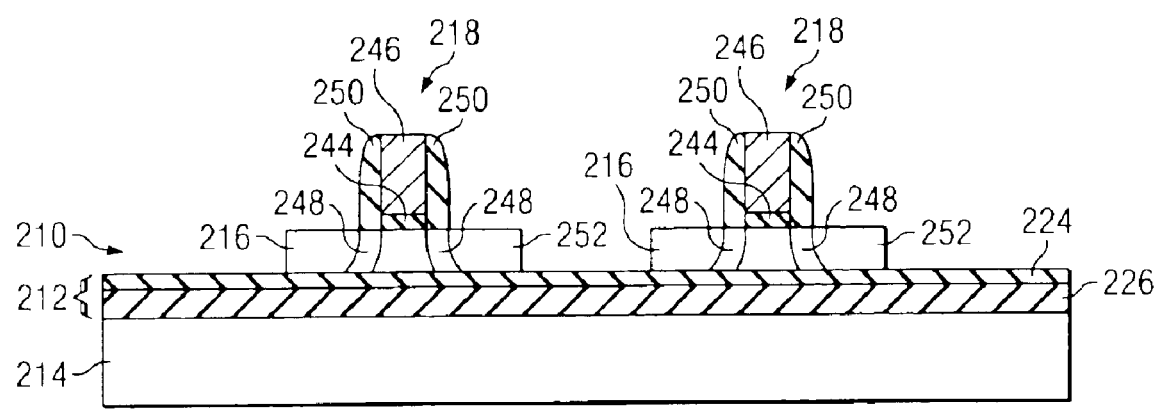

A typical active device or a transistor is formed as follows. The resulting structure is shown in FIG. 9d. The gate dielectric 244 may be formed by thermal oxidation, chemical vapor deposition, or sputtering. The gate dielectric 244 may comprise a conventional material such as silicon dioxide or silicon oxynitride with a thickness ranging from about 3 angstroms to about 100 angstroms, preferably about 10 angstroms or less. The gate dielectric 244 may also comprise of high permittivity (high-k) materials such as lanthalum oxide ($La_2O_3$), aluminum oxide ($Al_2O_3$), hafnium oxide $HfO_2$, haftium oxynitride (HfON), or zirconium oxide ($ZrO_2$), with an equivalent oxide thickness of about 3 angstroms to about 100 angstroms.

The gate electrode 246 material is then deposited. The gate material may be polycrystalline-silicon (poly-Si), poly-crystalline silicon-germanium (poly-SiGe), a refractory metal such as molybdenum and tungsten, compounds such as titanium nitride, or other conducting materials. A gate mask (not shown) is defined and the underlying gate material is etched to form the gate electrode. The gate etch stops on the gate dielectric 244, and the gate is electrically isolated from the transistor structure by the gate dielectric 244. In the preferred embodiment, the gate 246 material is poly-Si and the gate dielectric 244 is silicon oxynitride. A plasma etch using chlorine and bromine chemistry may be used for the gate electrode etching.

After gate 246 definition, the gate mask can be removed. The source and drain extensions 248 are formed next. This may be achieved by ion implantation, plasma immersion ion implantation (PIII), or other techniques known and used in the art.

Next, a spacer 250 is formed on the sidewalls of the gate 246 by deposition and selective etching of the spacer material. The spacer material may comprise of a dielectric material such as silicon nitride or silicon dioxide. In the preferred embodiment, the spacer 250 comprises silicon nitride.

After spacer formation, source and drain regions 252 are doped by ion implantation, PIII, gas or solid source diffusion, or any other techniques known and used in the art. Any implant damage or amorphization can be annealed through subsequent exposure to elevated temperatures. The resistance of the source, drain, and gate can also be reduced by strapping the source, drain, and gate with a conductive material (not shown). The conductive material may be a metallic silicide such as titanium silicide, cobalt silicide, or nickel silicide. In the preferred embodiment, the conductive material is nickel suicide which may be formed by a self-aligned silicide (salicide) process.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive.

What is claimed is:

1. A method of fabricating a semiconductor-on-insulator chip, comprising the steps of:

providing a donor wafer substrate;

implanting ions into said donor wafer substrate to form an implanted layer and a semiconductor film overlaying said implanted layer;

forming a recess-resistant layer of silicon nitride having an etch rate of less than 10 angstroms per minute in a wet cleaning solution, said recess-resistant layer overlying the semiconductor film, the recess-resistant layer forming the topmost layer of the a donor wafer;

providing a target wafer comprising of a recess-resistant layer of silicon nitride having an etch rate of less than 10 angstroms per minute in a wet cleaning solution, said recess-resistant layer overlying a first dielectric layer, the first dielectric layer overlying a substrate, the target wafer having a top surface;

beta bonding the top most recess-resistant layer of the donor wafer to the recess-resistant top surface of the target wafer;

cleaving the semiconductor film from the donor wafer, the semiconductor film adhering to the target wafer so as to provide a substrate device comprising a the semiconductor film overlying a buried insulator stack, the buried insulator stack comprising the recess-resistant layer overlying the first dielectric layer;

annealing the target wafer to strengthen the bond between semiconductor film and the target wafer after the semiconductor film adheres to the target wafer, and after the cleaving step forms the semiconductor film;

patterning a portion of the semiconductor film to form semiconductor mesas; and forming active devices on the semiconductor mesas.

2. The method of claim 1 wherein the semiconductor film comprises a silicon film.

3. The method of claim 2 wherein the semiconductor film comprises a strained silicon film.

4. The method of claim 3 wherein the strained silicon film is under tensile strain.

5. The method of claim 4 wherein the tensile strain has a magnitude of between about 0.01% and about 4%.

6. The method of claim 1 wherein the semiconductor film contains silicon and germanium.

7. The method of claim 1 wherein the donor wafer further includes the second dielectric, the second dielectric being the topmost layer of the donor wafer.

8. The method of claim 1 wherein the recess-resistant layers have a thickness of between about 10 angstroms and about 200 angstroms.

9. The method of claim 1 wherein the target wafer further comprises a second dielectric layer overlying the recess-resistant layer of the target wafer, the second dielectric layer being the topmost layer of the target wafer.

10. The method of claim 9 wherein the second dielectric layer comprises silicon oxide.

11. The method of claim 9 wherein the second dielectric layer has a thickness of between about 10 and about 200 angstroms.

12. The method of claim 1 wherein the first dielectric layer comprises silicon oxide.

13. The method of claim 1 wherein the first dielectric layer has a thickness of between about 100 angstroms and about 5000 angstroms.

14. The method of claim 1 wherein the target wafer substrate comprises a silicon substrate.

15. The method of claim 1 wherein the separating process is a controlled cleaving process.

16. The method of claim 1 wherein the separating process comprises an atomic layer cleaving process.

17. The method of claim 1 wherein the semiconductor film comprises silicon.

18. The method of claim 17 wherein the semiconductor comprises strained silicon.

19. The method of claim 1 wherein the recess-resistant layer is in contact with the semiconductor mesas.

20. The method of claim 1 wherein the buried insulator stack further comprises a second dielectric layer overlying the recess-resistant layer, the second dielectric layer being in contact with the semiconductor mesas.

21. The method of claim 20 wherein the second dielectric layer comprises silicon oxide.

22. The method of claim 20 wherein the second dielectric layer has a thickness of between about 10 and about 200 angstroms.

23. The method of claim 9, wherein each silicon mesa overlies a portion of the second dielectric layer, and wherein portions of the second dielectric layer that are not underlying the silicon mesa are removed to expose the silicon nitride layer.

24. The method of claim 23 wherein forming a plurality of silicon mesas comprising a plurality of strained silicon mesas.

25. The method of claim 23 wherein said nitride layer comprises forming a nitride layer having a thickness of between about 10 angstroms and about 200 angstroms.

26. The method of claim 23 wherein forming second oxide layer comprises forming a silicon oxide layer having a thickness of between about 10 and about 200 angstroms.

27. The method of claim 23 wherein the first oxide layer has a thickness of between about 100 angstroms and about 5000 angstroms.

28. The method of claim 1 the recess-resistant layer comprising $SiO_xN_y:H_x$.

29. The method of claim 28 wherein forming a semiconductor layer comprises forming a silicon layer.

30. The method of claim 29 wherein forming a semiconductor layer comprises forming a strained silicon layer.

31. The method of claim 30 wherein forming a semiconductor layer comprises forming a silicon layer, wherein the strained silicon is under tensile strain.

32. The method of claim 31 wherein the tensile strain has a magnitude of between about 0.01% and about 4%.

33. The method of claim 28 wherein the semiconductor layer contains silicon and germanium.

34. The method of claim 28 wherein the recess-resistant layer has a thickness of between about 10 angstroms and about 200 angstroms.

35. The method of claim 28 wherein the recess-resistant layer is in contact with the semiconductor layer.

36. The method of claim 28 wherein the buried insulator stack further comprises a second dielectric layer overlying the recess-resistant layer, the second dielectric layer being in contact with the semiconductor layer.

37. The method of claim 36 wherein the second dielectric layer comprises silicon oxide.

38. The method of claim 37 wherein the second dielectric layer has a thickness of between about 10 and about 200 angstroms.

39. The method of claim 28 wherein the first dielectric layer comprises silicon oxide.

40. The method of claim 39 wherein the first dielectric layer has a thickness of between about 100 angstroms and about 5000 angstroms.

41. The method of claim 28 wherein the substrate comprises a silicon substrate.

42. The method of claim 1 wherein the silicon nitride layer comprises $Si_3N_4$.

43. The method of claim 1 wherein the silicon nitride layer comprises $SiO_xN_y$.

44. The method of claim 1 wherein the silicon nitride layer comprises $Si_xN_y$.

* * * * *

UNITED STATES PATENT AND TRADEMARK OFFICE
CERTIFICATE OF CORRECTION

PATENT NO. : 6,949,451 B2
DATED : September 27, 2005
INVENTOR(S) : Yeo et al.

It is certified that error appears in the above-identified patent and that said Letters Patent is hereby corrected as shown below:

Column 12,
Line 20, delete "$H_x$" and insert -- $H_z$ --.

Signed and Sealed this

Thirteenth Day of December, 2005

JON W. DUDAS
*Director of the United States Patent and Trademark Office*